United States Patent
Yang et al.

(10) Patent No.: US 7,323,935 B2
(45) Date of Patent: Jan. 29, 2008

(54) TRANSCONDUCTANCE AMPLIFIER HAVING COMMON MODE FEEDBACK CIRCUIT AND METHOD OF OPERATING THE TRANSCONDUCTANCE AMPLIFIER

(75) Inventors: Sung-Gi Yang, Seongnam-si (KR); Yeon-Kug Moon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 121 days.

(21) Appl. No.: 11/271,455

(22) Filed: Nov. 10, 2005

(65) Prior Publication Data

US 2006/0097788 A1 May 11, 2006

(30) Foreign Application Priority Data

Nov. 11, 2004 (KR) ...................... 10-2004-0091678

(51) Int. Cl.
*H03F 3/45* (2006.01)
(52) U.S. Cl. ...................... 330/258; 330/253
(58) Field of Classification Search ................ 330/253, 330/258
See application file for complete search history.

(56) References Cited

U.S. PATENT DOCUMENTS

| | | | |
|---|---|---|---|
| 5,332,937 A | 7/1994 | Castello et al. | |
| 5,696,457 A | 12/1997 | Rezzi et al. | |
| 5,936,466 A | 8/1999 | Andoh et al. | |
| 6,052,025 A * | 4/2000 | Chang et al. | 330/253 |
| 6,272,688 B1 | 8/2001 | Wilson | |
| 6,577,183 B1 | 6/2003 | Nakamura et al. | |
| 6,608,525 B2 | 8/2003 | Kizaki | |
| 6,707,322 B2 | 3/2004 | Lee et al. | |

FOREIGN PATENT DOCUMENTS

KR 20040018658 3/2004

OTHER PUBLICATIONS

English Abstract.
Jose Silva-Martinez, et al., "A 60-MW 200 MHZ Continuous-Time Seventh-Order Linear Phase Filter With On-Chip Automatic Tuning System," pp. 216-225, *IEEE Journal of Solid-State Circuits*, vol. 38, No. 2, Feb. 2003.

* cited by examiner

*Primary Examiner*—Robert Pascal
*Assistant Examiner*—Hieu Nguyen
(74) *Attorney, Agent, or Firm*—F. Chau & Associates, LLC (57) ABSTRACT

A complementary transconductance amplifier having a common mode feedback circuit includes a first-type transconductor, a second-type transconductor and a common mode feedback circuit. The first-type transconductor generates a first differential output signal pair in response to a differential input signal pair under the control of a first control signal. The second-type transconductor generates a second differential output signal pair in response to the differential input signal pair under the control of a second control signal. The common mode feedback circuit generates the second control signal in response to the first and second differential output signal pairs under the control of a common mode control signal.

19 Claims, 13 Drawing Sheets

TRANSCONDUCTANCE AMPLIFIER HAVING COMMON MODE FEEDBACK CIRCUIT AND METHOD OF OPERATING THE TRANSCONDUCTANCE AMPLIFIER

CROSS-REFERENCE TO RELATED APPLICATIONS

This application claims priority to Korean Patent Application No. 2004-91678 filed on Nov. 11, 2004, the contents of which are herein incorporated by reference in its entirety.

BACKGROUND OF THE INVENTION

1. Field of the Invention

The present invention relates to a transconductance amplifier, and more particularly to a complementary transconductance amplifier having a common mode feedback circuit and a method of amplifying the transconductance of the amplifier.

2. Description of Related Art

A transconductance amplifier is a circuit block that amplifies a voltage signal with a predetermined gain. Transconductance amplifiers may be used in applications such as Gm-C filters. The transconductance amplifier needs to have a high operating frequency, a low operating current, a high linearity and a broad tuning range. A typical transconductance amplifier has a structure of a differential amplifier and has a function of controlling a variable gain.

Figure 1:
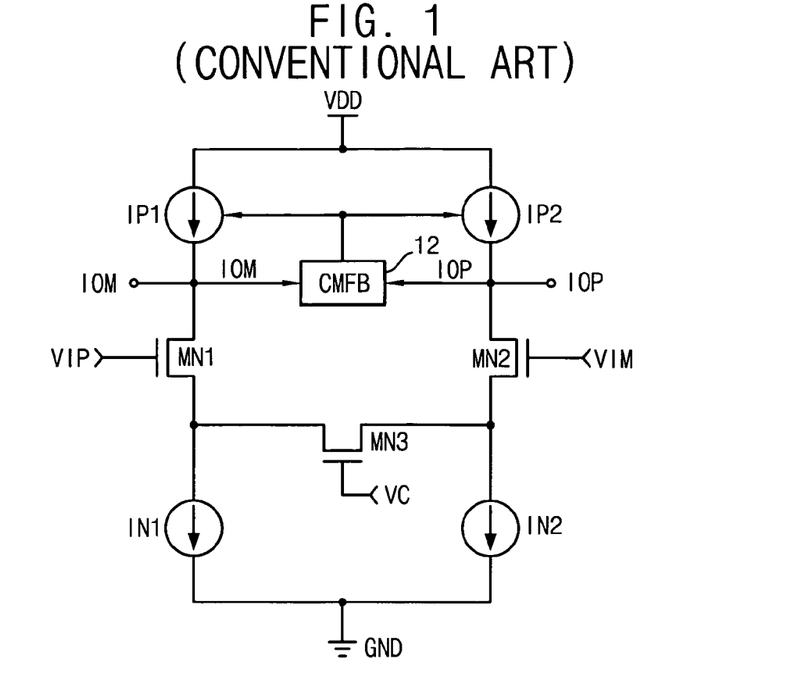
FIG. 1 is a circuit diagram illustrating an example of a conventional transconductance amplifier.

FIG. 1 is a circuit diagram illustrating an example of a conventional transconductance amplifier, and is disclosed in U.S. Pat. No. 6,271,688. Referring to FIG. 1, input voltages VIP and VIM are applied to the gates of NMOS transistors MN1 and MN2. An NMOS transistor MN3, coupled between the sources of the NMOS transistors MN1 and MN2, operates in a triode region and functions as a variable resistor. Transconductance (Gm), which is represented as IO/VI, is controlled by controlling a control voltage VC that is applied to a gate of the NMOS transistor MN3. The transconductance amplifier of FIG. 1 includes a common mode feedback circuit (CMFB) 12 to stabilize an output common mode voltage.

Figure 2:
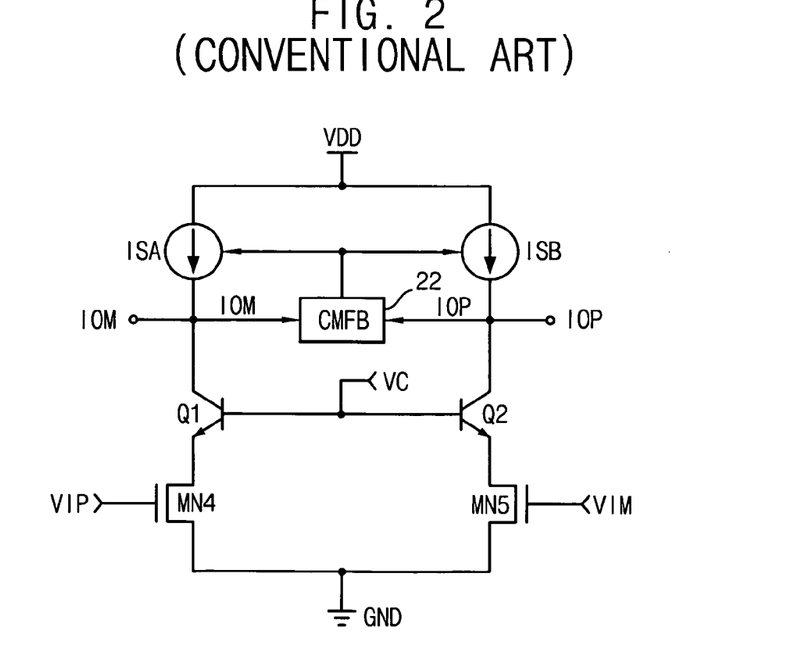
FIG. 2 is a circuit diagram illustrating another example of a conventional transconductance amplifier.

FIG. 2 is a circuit diagram illustrating another example of a conventional transconductance amplifier, and is disclosed in U.S. Pat. No. 5,332,937. Referring to FIG. 2, NMOS transistors MN4 and MN5, to which input voltages VIP and VIM are applied, operate in a triode region. Drain voltages of the NMOS transistors MN4 and MN5 are controlled in response to the control voltage VC, which is applied to bases of bipolar transistors Q1 and Q2. Therefore, transconductance (Gm) is controlled by way of controlling the control voltage VC.

Figure 3:
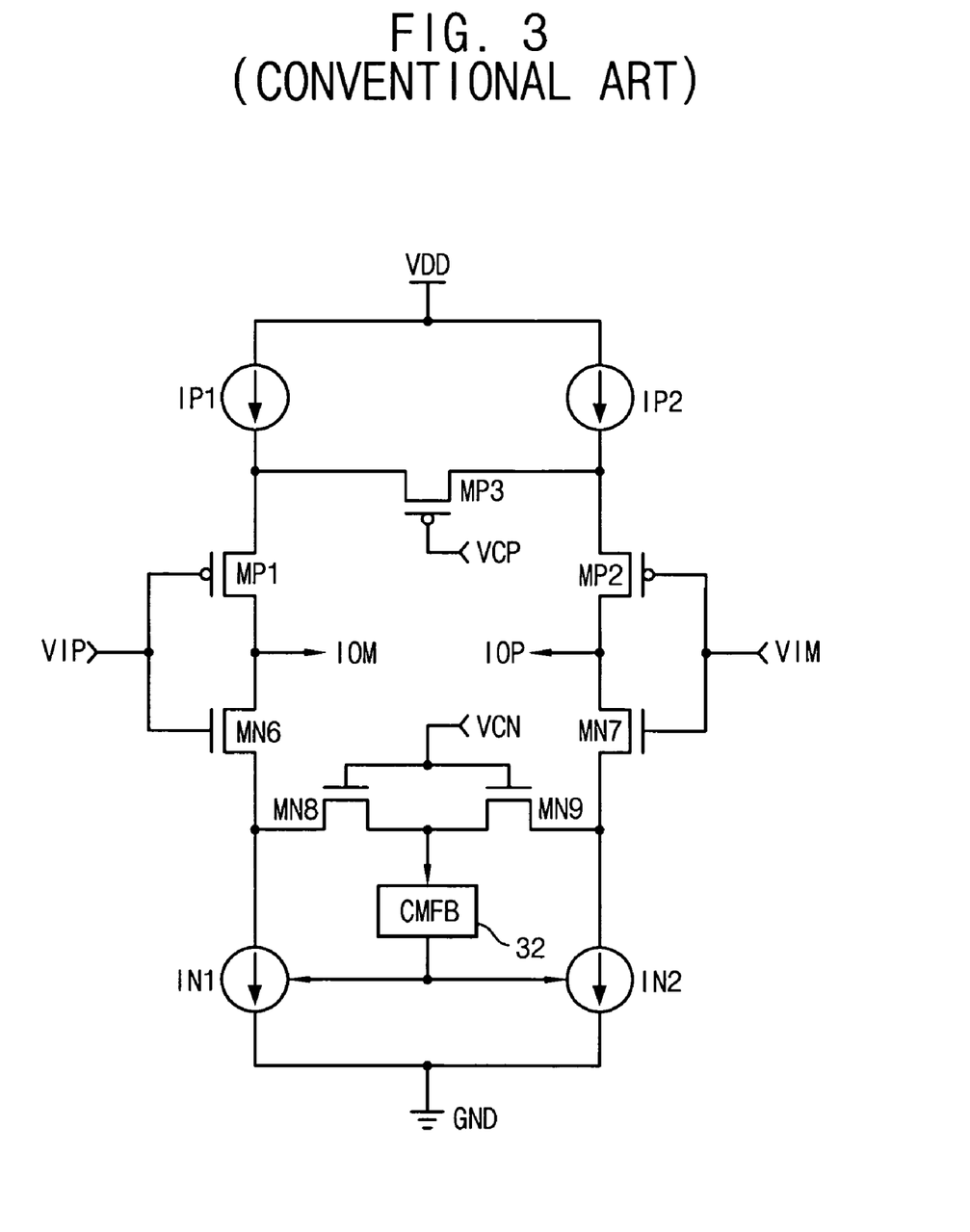
FIG. 3 is a circuit diagram illustrating still another example of a conventional transconductance amplifier.

FIG. 3 is a circuit diagram illustrating still another example of a conventional transconductance amplifier, and is described in Martinez et al., "A 60-mW 200-MHz continuous time seventh-order linear phase filter with on-chip automatic tuning system," IEEE J. Solid-State Circuits, February 2003, Vol. 38, Issue 2, pp. 216-225. The transconductance amplifier of FIG. 3 has a complementary structure. A common mode feedback circuit 32 enables the output common mode voltage to have a constant value even though the transconductance (Gm) of FIG. 3 changes. Transconductance amplifiers having a complementary structure such as the transconductance amplifier of FIG. 3 have reduced current consumption and noise.

In the transconductance amplifier of FIG. 3, the transconductance of an N-type transconductor comprising NMOS transistors MN6 and MN7 is controlled by a control voltage VCN, and the transconductance of a P-type transconductor comprising PMOS transistors MP1 and MP2 is controlled by a control voltage VCP. In the transconductance amplifier of FIG. 3, one of the control voltages VCP and VCN needs to have a fixed value because the control voltages VCP and VCN are independent from each other. Accordingly, the transconductance (Gm) control range of the transconductance amplifier of FIG. 3 may be reduced by about 50% as compared with the transconductance amplifier of FIG. 1, and a degree of symmetry between the N-type transconductor and the P-type transconductor may be reduced.

The noise of the transconductance amplifier of FIG. 3 may be increased because of current sources IP1 and IP2, placed between the supply voltage VDD and the P-type transconductor, and current sources IN1 and IN2, placed between ground GND and the N-type transconductor.

The transconductance amplifier of FIG. 3 may have a lower linearity than the transconductance amplifier of FIG. 1 having NMOS transistors MN4 and MN5, which operate in a triode region, because the PMOS transistors MP1 and MP2 and the NMOS transistors MN1 and MN2 operate in a saturation region.

Accordingly, there is a need for a transconductance amplifier that has an increased linearity, a reduced operating current, an improved noise characteristic and a broad tuning range of transconductance (Gm).

SUMMARY OF THE INVENTION

According to an exemplary embodiment of the present invention, a transconductance amplifier includes a first-type transconductor, a second-type transconductor and a common mode feedback circuit.

The first-type transconductor generates a first differential output signal pair in response to a differential input signal pair under the control of a first control signal. The second-type transconductor generates a second differential output signal pair in response to the differential input signal pair under the control of a second control signal. The common mode feedback circuit generates the second control signal in response to the first and second differential output signal pairs under the control of a common mode control signal.

According to an exemplary embodiment of the present invention, the first control signal is a signal received from an exterior of the transconductance amplifier.

According to an exemplary embodiment of the present invention, the first-type transconductor is coupled to a first supply voltage and the second-type transconductor is coupled to a second supply voltage that is complementary to the first supply voltage.

According to an exemplary embodiment of the present invention, a method of amplifying transconductance includes generating a first differential output signal pair in response to a differential input signal pair under the control of a first control signal, generating a second differential output signal pair in response to the differential input signal pair under the control of a second control signal, and generating the second control signal in response to the first and second differential output signal pairs under the control of a common mode control signal.

BRIEF DESCRIPTION OF THE DRAWINGS

The present invention will be apparent from the description of preferred embodiments, as illustrated in the accompanying drawing. The drawings are not necessarily to scale, emphasis instead being placed upon illustrating embodiments of the present invention. Like reference characters refer to like elements throughout the drawings.

DETAILED DESCRIPTION OF PREFERRED EMBODIMENTS

Exemplary embodiments of the present invention are disclosed herein.

Figure 4:
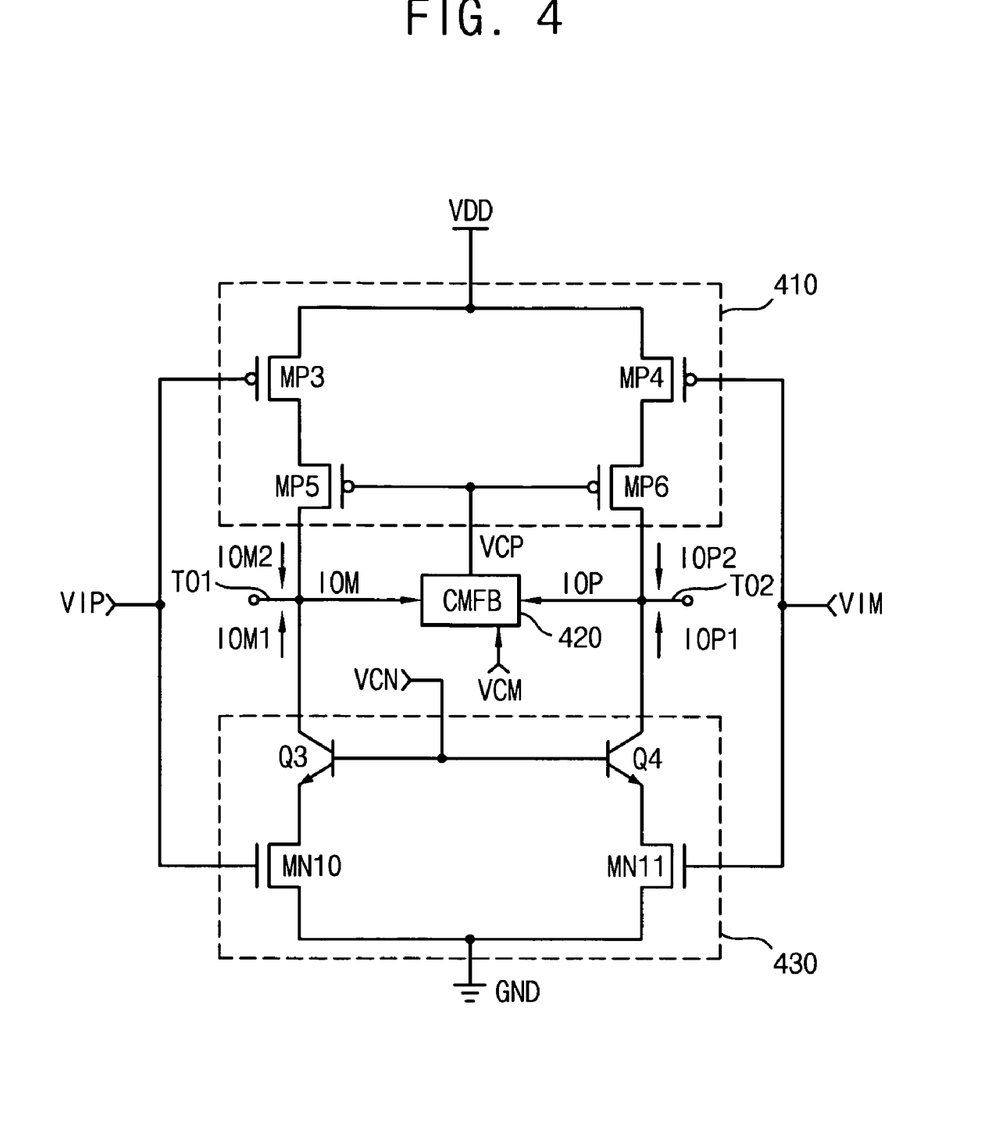
FIG. 4 is a circuit diagram illustrating a transconductance amplifier according to an exemplary embodiment of the present invention.

FIG. 4 is a circuit diagram illustrating a transconductance amplifier according to an exemplary embodiment of the present invention. Referring to FIG. 4, the transconductance amplifier includes an N-type transconductor 430, a P-type transconductor 410, and a common mode feedback circuit 420.

The N-type transconductor 430 generates a first differential output signal pair IOP1 and IOM1 in response to a differential input signal pair VIP and VIM under the control of a control signal VCN. The P-type transconductor 410 generates a second differential output signal pair IOP2 and IOM2 in response to the differential input signal pair VIP and VIM under the control of a control signal VCP. The common mode feedback circuit 420 generates the control signal VCP in response to the first differential output signal pair IOP1 and IOM1, and the second differential output signal pair IOP2 and IOM2 under the control of a common mode control signal VCM.

The N-type transconductor 430 includes NMOS transistors MN10 and MN11 and NPN transistors Q3 and Q4. The NMOS transistor MN10 has a gate to which the input signal VIP is applied and a source coupled to the ground. The NPN transistor Q3 has a base to which the control signal VCN is applied, an emitter coupled to a drain of the NMOS transistor MN10 and a collector coupled to a first output terminal TO1. The NPN transistor Q4 has a base to which the control signal VCN is applied, an emitter coupled to a drain of the NMOS transistor MN11 and a collector coupled to a second output terminal TO2.

The P-type transconductor 410 includes PMOS transistors MP3 to MP6. The PMOS transistor MP3 has a gate to which the input signal VIP is applied and a source coupled to a supply voltage VDD. The PMOS transistor MP4 has a gate to which the input signal VIM is applied and a source coupled to the supply voltage VDD. The PMOS transistor MP5 has a gate to which the control signal VCP is applied, a source coupled to the drain of the PMOS transistor MP3 and a drain coupled to the first output terminal TO1. The PMOS transistor MP6 has a gate to which the control signal VCP is applied, a source coupled to the drain of the PMOS transistor MP4 and a drain coupled to the second output terminal TO2.

Hereinafter, referring to FIG. 4, the operation of the transconductance amplifier according to an exemplary embodiment of the present invention will be described.

The transconductance amplifier of FIG. 4 is a complementary transconductance amplifier including the N-type transconductor 430 and the P-type transconductor 410. The N-type transconductor 430 includes the NMOS transistors MN10 and MN11 and the NPN transistors Q3 and Q4. The P-type transconductor 410 includes the PMOS transistors MP3 to MP6. The differential output signal IOP1 and the differential output signal IOP2 are summed to generate a first output current IOP. The differential output signal IOM1 and the differential output signal IOM2 are summed to generate a second output current IOM.

The common mode feedback circuit 420 generates the control signal VCP based on the first output current IOP and second output current IOM. When a common mode component of the two signals IOP and IOM is increased, the control signal VCP is increased and the differential output signals IOP2 and IOM2, which are output from the P-type transconductor 410, are decreased. When the common mode component of the two signals IOP and IOM is decreased, the control signal VCP is decreased and the differential output signals IOP2 and IOM2 are increased. The common mode feedback circuit 420 negatively feeds back the common mode component. As such, when a common mode component is negatively fed back, voltages of the output terminals TO1 and TO2 may be stabilized.

Figure 5:
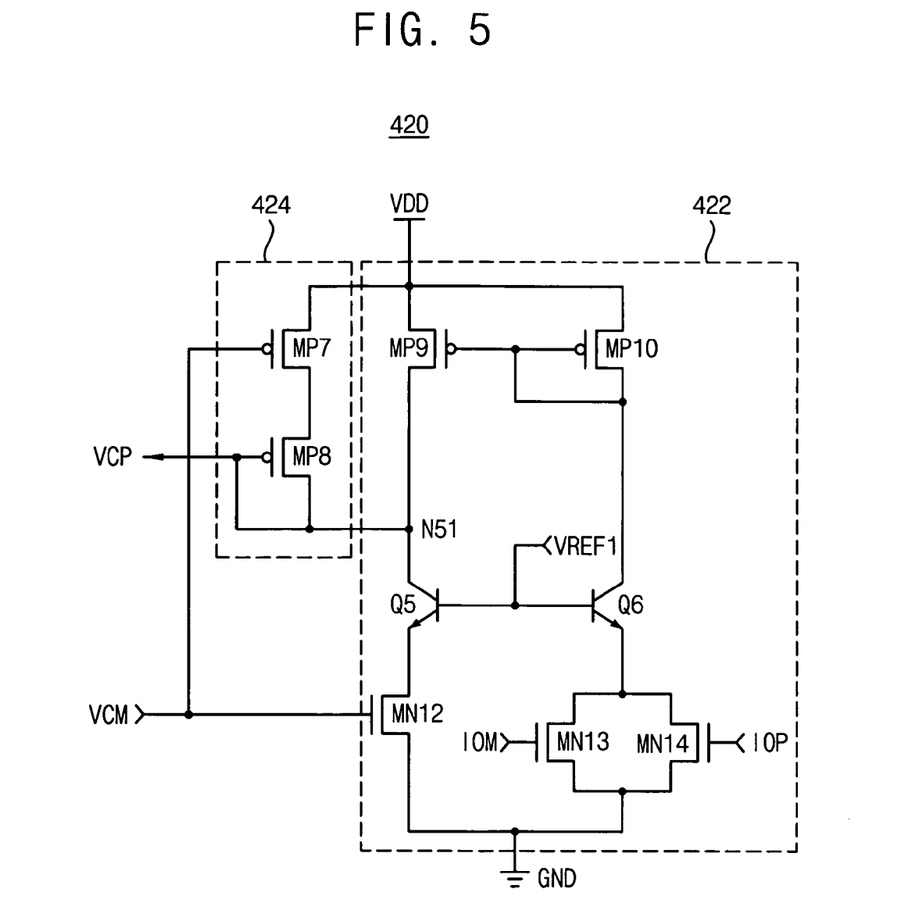
FIG. 5 is a circuit diagram illustrating an example of a common mode feedback circuit included in FIG. 4.

FIG. 5 is a circuit diagram illustrating an example of the common mode feedback circuit 420 depicted in FIG. 4. Referring to FIG. 5, the common mode feedback circuit 420 includes a common mode component comparator 422 and a voltage level limiting circuit 424. The common mode component comparator 422 compares the first output signal IOP and the second output signal IOM of the transconductance amplifier with the common mode control signal VCM and outputs the compared result. The voltage level limiting circuit 424 limits a variation range of an output signal of the common mode component comparator 422 to generate the control signal VCP.

The common mode component comparator 422 includes PMOS transistors MP9 and MP10, NMOS transistors MN12 to MN14 and NPN transistors Q5 and Q6. The voltage level limiting circuit 424 includes PMOS transistors MP7 and MP8.

Hereinafter, the operation of the common mode feedback circuit of FIG. 5 will be described.

The reference voltage VREF1 that is applied to a gate of the NPN transistors Q5 and Q6 may be set to have an appropriate voltage level. The control voltage VCN, which is applied to the N-type transconductor 430, may be used as the reference voltage VREF1. Common mode components of the differential output signals IOP and IOM are compared with the common mode control signal VCM. The differential mode components of the differential output signals IOP and IOM will not affect the voltage level of a node N51 because NMOS transistors MN13 and MN14 are connected in parallel.

When the common mode component of the differential output signals IOP and IOM is increased, the current flowing through the NPN transistor Q6 is increased. Accordingly, the current flowing through the PMOS transistor MP10 and the current flowing through the PMOS transistor MP9, which is a current-mirror connected to the PMOS transistor MP10, increase. Because the common mode control signal VCM maintains a constant voltage level, the current flowing through the NPN transistor Q5 may not vary. Therefore, the voltage of the node N51, which is the control signal VCP of the P-type transconductor 410, increases. When the control signal VCP is increased, the differential output signal pair IOP2 and IOM2 of the P-type transconductor 410 is decreased.

When the common mode component of the differential output signal pair IOP2 and IOM2 is decreased, the current flowing through the NPN transistor Q6 is decreased. Accordingly, the current flowing through the PMOS transistor MP10 and the current flowing through the PMOS transistor MP9, which is a current-mirror connected to the PMOS transistor MP10, decrease. Because the common mode control signal VCM maintains a constant voltage level, the current flowing through the NPN transistor Q5 may not vary. Therefore, the voltage of the node N51, which is the control signal VCP of the P-type transconductor 410, decreases. When the control signal VCP is decreased, the differential output signal pair IOP2 and IOM2 of the P-type transconductor 410 is increased.

The transconductance amplifier of FIG. 4 according to an exemplary embodiment of the present invention may stabilize the voltage on the output terminals TO1 and TO2 using a common mode feedback circuit 420. Further, the transconductance amplifier of FIG. 4 receives only one control signal VCN from an external source to control the N-type transconductor 430, and the output signal of the common mode feedback circuit 420 is used as the control voltage VCP of the P-type transconductor 430. Accordingly, in the transconductance amplifier according to an exemplary embodiment of the present invention shown in FIG. 4, the degree of symmetry may be maintained even though the transconductance (Gm) changes.

Figure 6:
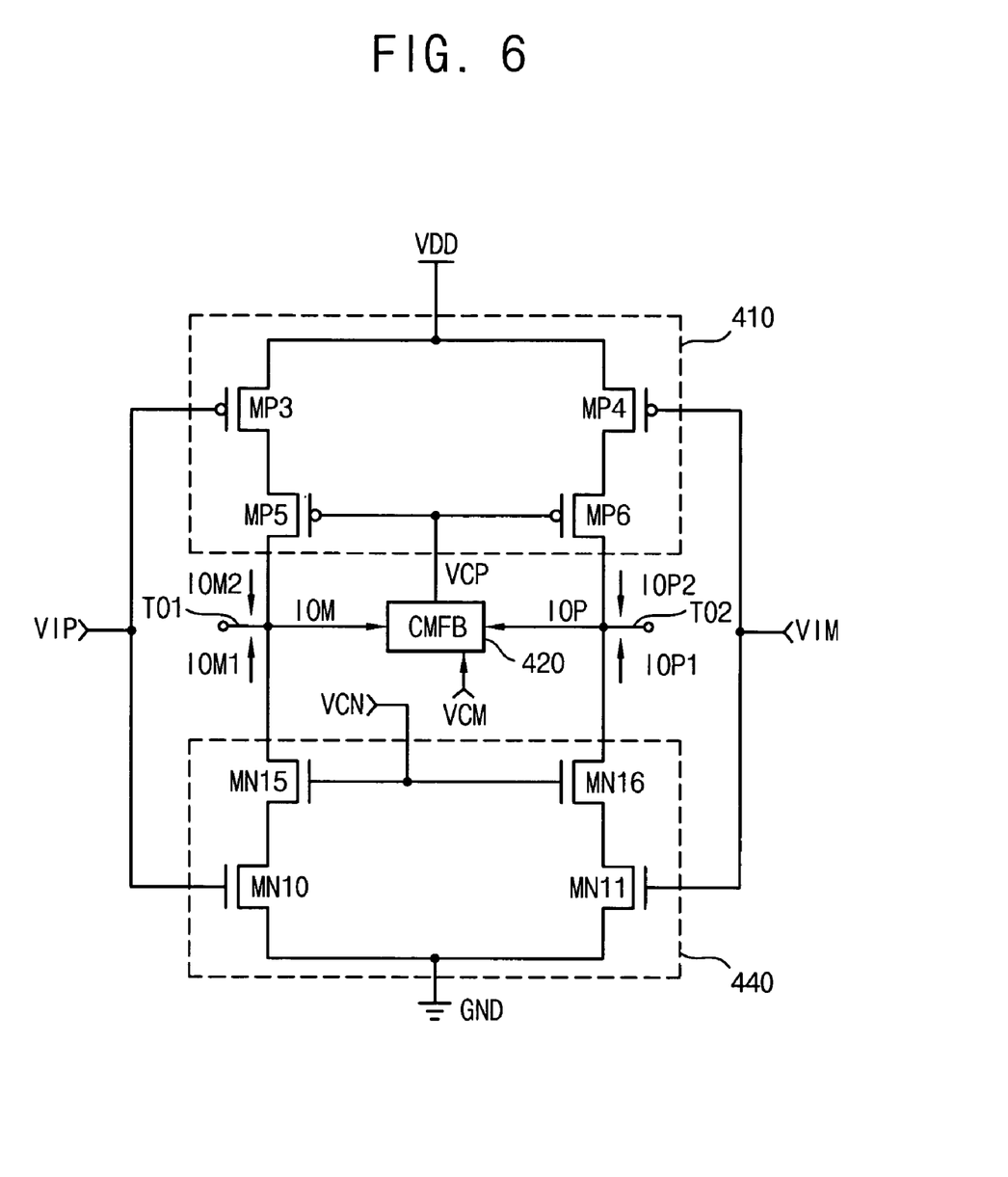
FIG. 6 is a circuit diagram illustrating a transconductance amplifier according to an exemplary embodiment of the present invention.

FIG. 6 is a circuit diagram illustrating a transconductance amplifier according to an exemplary embodiment of the present invention. The transconductance amplifier of FIG. 6 is a complementary transconductance amplifier including an N-type transconductor 440 and a P-type transconductor 410.

Referring to FIG. 6, the N-type transconductor 440 includes the NMOS transistors MN10, MN11, and NMOS transistors MN15 and MN16. The input signal VIP is applied to the gate of the NMOS transistor MN10 and the source of the NMOS transistor MN10 is coupled to the ground GND. The input signal VIM is applied to the gate of the NMOS transistor MN11 and the source of the NMOS transistor MN11 is coupled to the ground GND. The NMOS transistor MN15 has a gate to which the control signal VCN is applied, a source coupled to the drain of the NMOS transistor MN10 and a drain coupled to the first output terminal TO1. The NMOS transistor MN16 has a gate to which the control signal VCN is applied, a source coupled to the drain of the NMOS transistor MN11 and a drain coupled to the second output terminal TO2.

The transconductance amplifier of FIG. 6 may be implemented in a semiconductor integrated circuit using a CMOS fabrication process because the N-type transconductor 440, the P-type transconductor 410 and the common mode feedback circuit 420 are comprised of MOS transistors. The operation of the transconductance amplifier of FIG. 6 is substantially similar to the operation of the transconductance amplifier of FIG. 4. Therefore, a detailed description referring to the particular operation of the transconductance amplifier of FIG. 6 is omitted.

Figure 7:
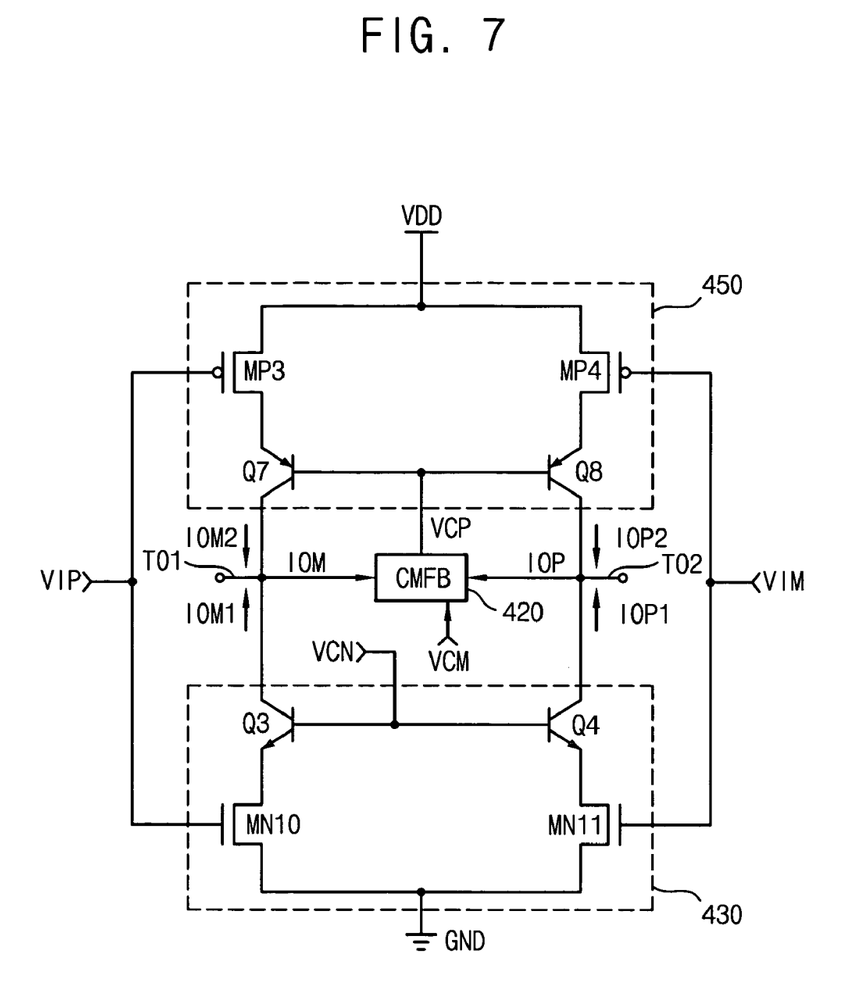
FIG. 7 is a circuit diagram illustrating a transconductance amplifier according to an exemplary embodiment of the present invention.

FIG. 7 is a circuit diagram illustrating a transconductance amplifier according to an exemplary embodiment of the present invention. The transconductance amplifier of FIG. 7 is a complementary transconductance amplifier including an N-type transconductor 430 and a P-type transconductor 450.

Referring to FIG. 7, the P-type transconductor 450 includes the PMOS transistors MP3 and MP4 and PNP transistors Q7 and Q8. The input signal VIP is applied to the gate of the PMOS transistor MP3 and the source of the PMOS transistor MP3 is coupled to the supply voltage VDD. The input signal VIM is applied to the gate of the PMOS transistor MP4 and the source of the PMOS transistor MP4 is coupled to the supply voltage VDD. The PNP transistor Q7 has a base to which the control signal VCP is applied, an emitter coupled to the drain of the PMOS transistor MP3 and a collector coupled to the first output terminal TO1. The PNP transistor Q8 has a gate to which the control signal VCP is applied, an emitter coupled to the drain of the PMOS transistor MP4 and a collector coupled to the second output terminal TO2.

In the transconductance amplifier of FIG. 7, each of the drain voltages of the NMOS transistors MN10 and MN11, to which the differential input signals VIP and VIM are applied, has a voltage level corresponding to the voltage level of the control signal VCN minus a base-emitter voltage (Vbe) of the NPN transistors Q3 and Q4. Each of the drain voltages of the PMOS transistors MP3 and MP4 to which the differential input signals VIP and VIM are applied has a voltage level corresponding to the voltage level of the control signal VCP plus a base-emitter voltage (Vbe) of the PNP transistors Q7 and Q8. Therefore, the drain voltages of the MOS transistors MN10, MN11, MP3 and MP4, to which the differential input signals VIP and VIM are applied, may be stabilized.

Figure 8A:
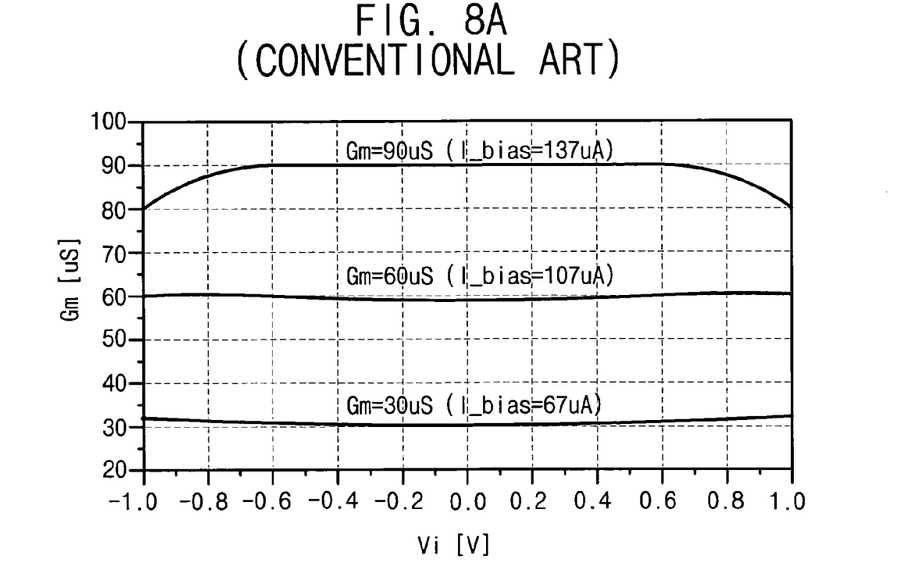
FIG. 8A and FIG. 8B are graphs that illustrate transconductances versus input voltages for the conventional transconductance amplifier of FIG. 2 and the transconductance amplifier of FIG. 4, respectively.
Figure 8B:
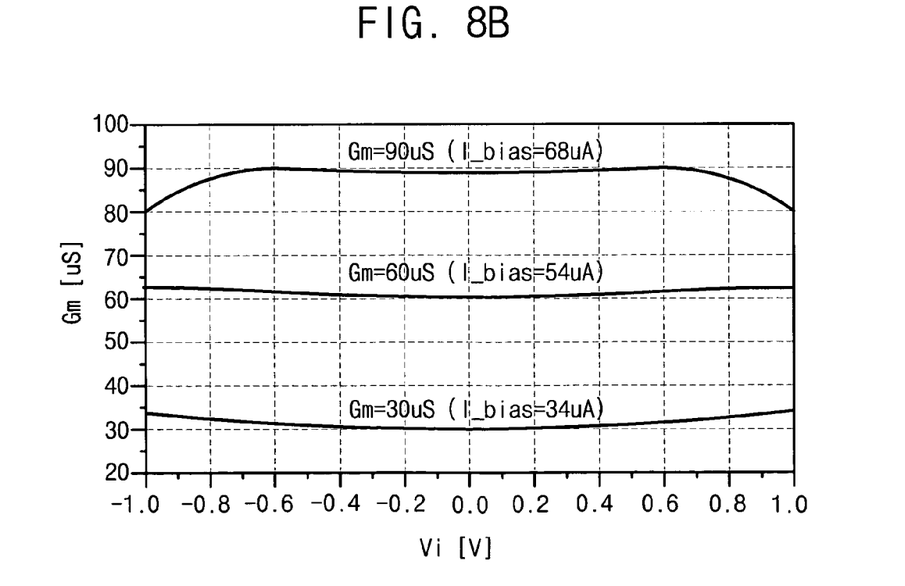

FIG. 8A and FIG. 8B are graphs that illustrate transconductances versus input voltages for the conventional transconductance amplifier of FIG. 2 and the transconductance amplifier of FIG. 4, respectively.

FIG. 8A is a graph illustrating simulation results of a Gm-C filter constructed using the conventional transconductance amplifier of FIG. 2 when a bias current is varied. FIG. 8B is a graph illustrating simulation results of a Gm-C filter constructed using the transconductance amplifier of FIG. 4 when a bias current is varied. Referring to FIG. 8A and FIG. 8B, the linearity of the transconductance amplifier of FIG. 4 may be similar to the linearity of the conventional transconductance amplifier of FIG. 2. However, the bias current I_bias of the transconductance amplifier of FIG. 4 is lower than the bias current I_bias of the conventional transconductance amplifier of FIG. 2, in achieving substantially the same transconductance (Gm). Referring to FIG. 8A and FIG. 8B, the bias current I_bias needed to achieve a Gm of 30 uS (micro-Siemens) is about 67 uA for the conventional transconductance amplifier of FIG. 2, and about 34 uA for the transconductance amplifier of FIG. 4. The bias current I_bias of the transconductance amplifier according to an exemplary embodiment of the present invention may be reduced to about one half of the bias current I_bias of the conventional transconductance amplifier.

Figure 9:
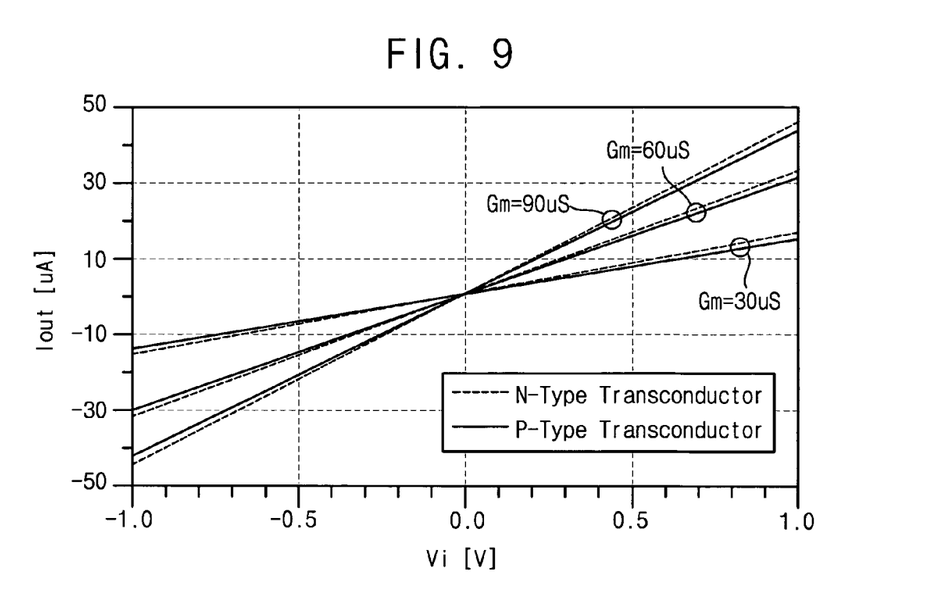
FIG. 9 is a graph that illustrates an output current versus an input voltage of the transconductance amplifier of FIG. 4.

FIG. 9 is a graph that illustrates an output current Iout versus an input voltage Vi for the transconductance amplifier of FIG. 4. Referring to FIG. 9, the output current of the N-type transconductor is consistent with the output current of the P-type transconductor, and the complementary characteristic is maintained.

Figure 10:
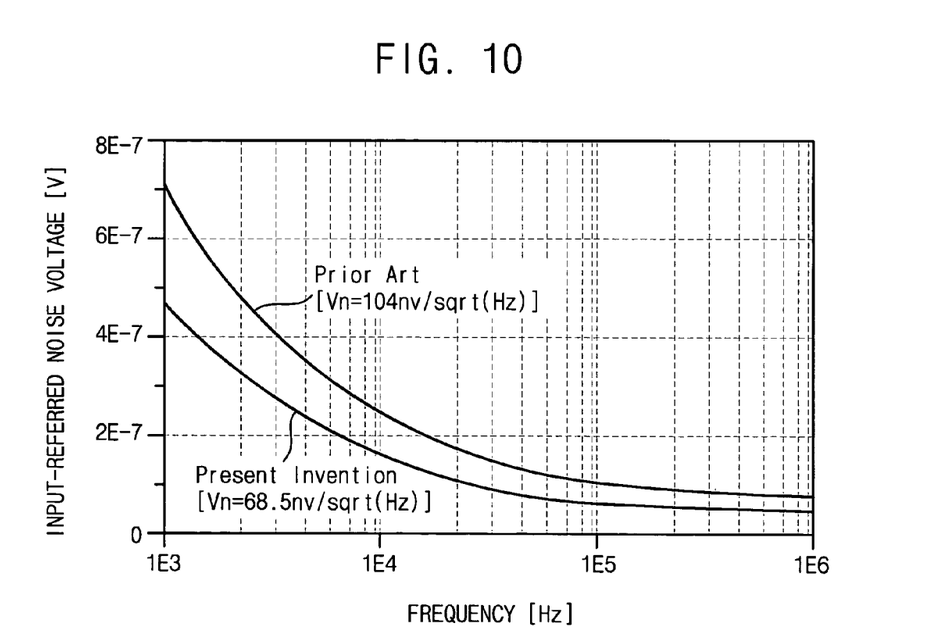
FIG. 10 is a graph that illustrates an input noise voltage versus a frequency of the transconductance amplifier of FIG. 4.

FIG. 10 is a graph that illustrates an input noise voltage versus a frequency for the transconductance amplifier of FIG. 4. Referring to FIG. 10, the noise voltage of the transconductance amplifier of FIG. 4 is smaller than the noise of the conventional transconductance amplifier of FIG. 2. The simulation result represents that the noise voltage of the transconductance amplifier of FIG. 4 is approximately 65% of the noise of the conventional transconductance amplifier of FIG. 2.

Figure 11:
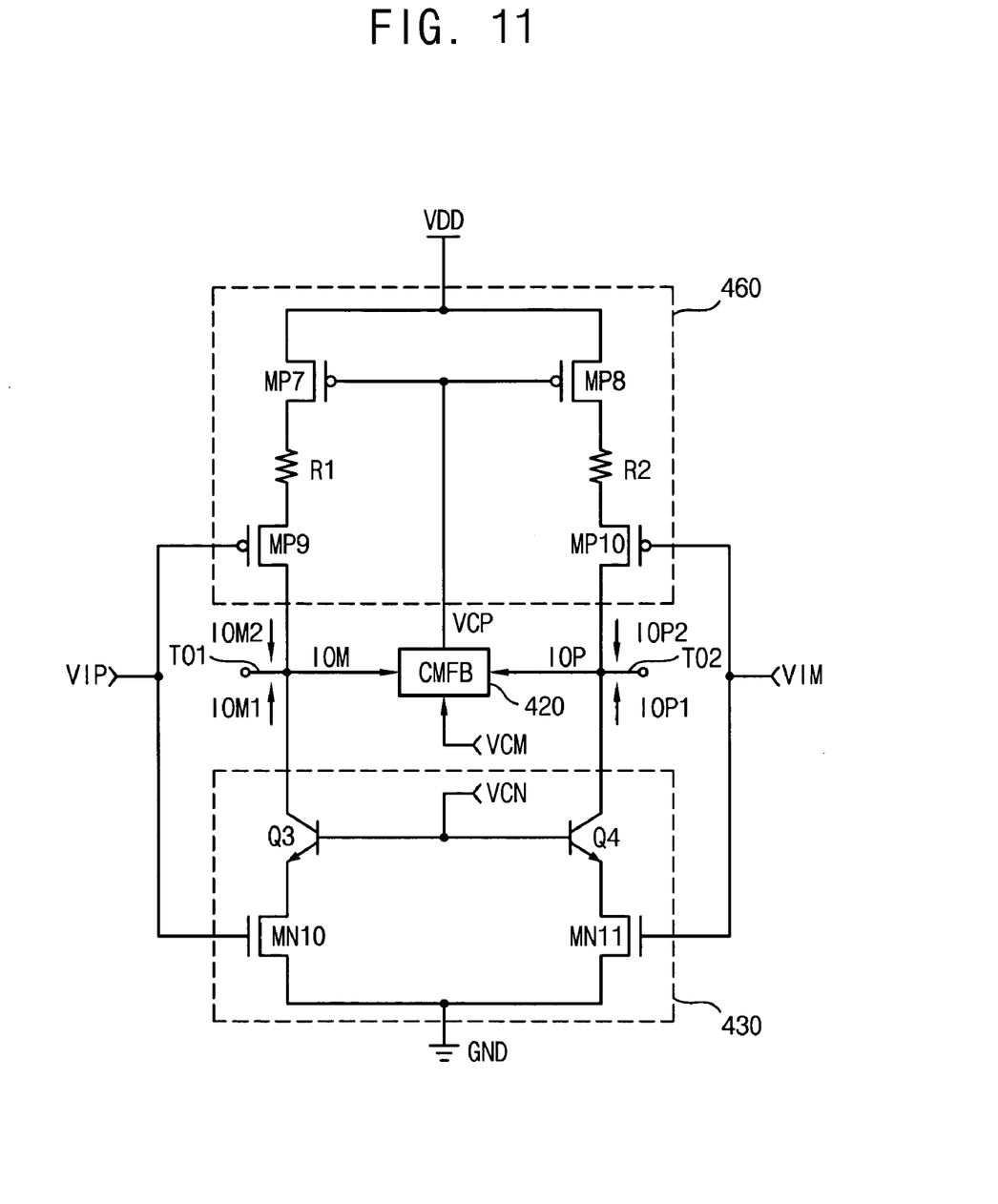
FIG. 11 is a circuit diagram illustrating a transconductance amplifier according to an exemplary embodiment of the present invention.

FIG. 11 is a circuit diagram illustrating a transconductance amplifier according to an exemplary embodiment of the present invention. In the transconductance amplifier FIG. 11, the N-type transconductor 430 and the P-type transconductor 460 are not fully symmetric to each other. Referring to FIG. 11, the transconductance amplifier includes the N-type transconductor 430, a P-type transconductor 460, and the common mode feedback circuit 420. The P-type transconductor 460 includes PMOS transistors MP7 to MP10 and resistors R1 and R2. The PMOS transistor MP7 has a gate to which the control signal VCP is applied and a source coupled to the supply voltage VDD. The PMOS transistor MP8 has a gate to which the control signal VCP is applied and a source coupled to the supply voltage VDD. The resistor R1 has a first terminal coupled to a drain of the PMOS transistor MP7. The resistor R2 has a first terminal coupled to a drain of the PMOS transistor MP8. The PMOS transistor MP9 has a gate to which the input signal VIP is applied, a source coupled to a second terminal of the resistor R and a drain coupled to the first output terminal TO1. The PMOS transistor MP10 has a gate to which the input signal VIM is applied, a source coupled to a second terminal of the resistor R2 and a drain coupled to the second output terminal TO2.

Hereinafter, the operation of the transconductance amplifier of FIG. 11 will be described.

In the circuit of FIG. 11, the input transistor pair MN10 and MN11 in the N-type transconductor 430 is comprised of NMOS transistors operating in the triode region, and the input transistor pair MP9 and MP10 in the P-type transconductor 460 is comprised of source-degenerate PMOS transistors operating in a saturation region. The resistors R1 and R2 are used to stabilize operation of the PMOS transistors MP7 and MP8 in the triode region and improve the linearity of the P-type transconductor 460. Further, the resistors R1 and R2 are used to control an amount of variation of transconductance Gm of the P-type transconductor 460 in response to the control signal VCN. The complementary transconductance amplifier of FIG. 11 may cancel a non-linearity generated between both transconductors 430 and 460 by using the P-type transconductor 460 and the N-type transconductor 430 that are asymmetric to each other.

Figure 12:
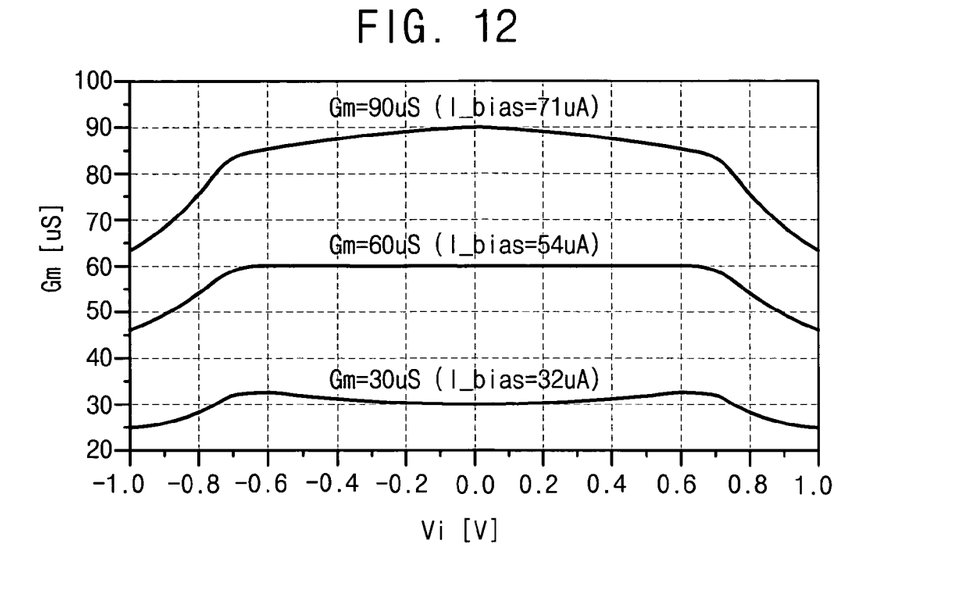
FIG. 12 is a graph that illustrates transconductance versus an input voltage for the transconductance amplifier of FIG. 11.

FIG. 12 is a graph that illustrates transconductance versus an input voltage for the transconductance amplifier of FIG. 11. Referring to FIG. 11, the range of the input voltage Vi that is needed to keep the transconductance Gm substantially constant is narrower than the case of FIG. 8B that represents the transconductance Gm of the transconductance amplifier of FIG. 4. The range of the input voltage Vi is narrower because the input transistor pair MP9 and MP10 of the P-type transconductor 460 operate in the saturation region.

In the transconductance amplifier of FIG. 11, the input transistor pair MN10 and MN11 of the N-type transconductor 430 operate in the triode region, and the input transistor pair MP9 and MP10 of the P-type transconductor 460 operates in the saturation region. As such, when the two transconductors that are complementary to each other operate in the different regions, a third order non-linearity generated in each of the transconductors may be cancelled. This principle is described in Morozov et al., "A realization of low-distortion CMOS transconductor amplifier," IEEE Trans. Circuit and Systems, September 2001, Vol. 48, Issue 9, pp. 1138-1141. In Morozov et al., an example is disclosed in which non-linearity components offset each other in the two N-type transconductors connected in parallel, the two transconductors each operating in the different regions of operation.

Figure 13:
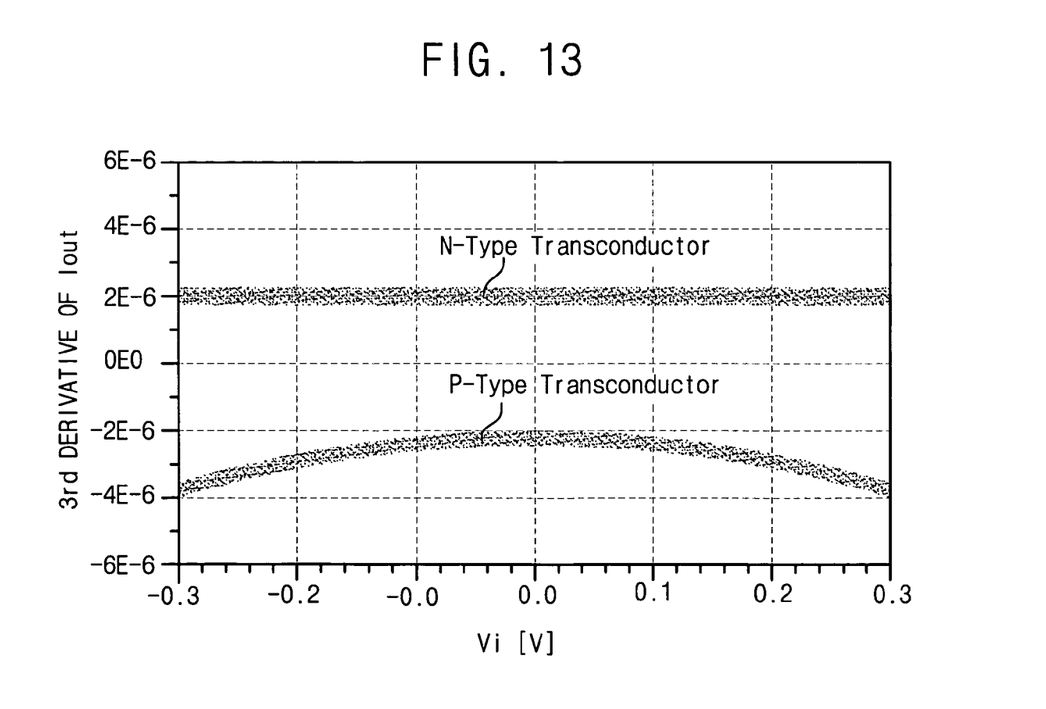
FIG. 13 is a graph that illustrates a third order differentiation coefficient versus an input voltage for an N-type transconductor and a P-type transconductor of the transconductance amplifier of FIG. 11.

FIG. 13 is a graph that illustrates a third order differentiation coefficient versus an input voltage for the N-type transconductor 430 and the P-type transconductor 460 of the transconductance amplifier of FIG. 11. In FIG. 13, the output current Iout when the input voltage Vi is 0V represents the third order non-linearity coefficient of the output current Iout. Referring to FIG. 13, the third order non-linearity coefficient is about $2 \times 10^{-6}$ for the N-type transconductor 430 and about $-2 \times 10^{-6}$ for the P-type transconductor 460. That is, the third order non-linearity coefficient of the N-type transconductor has substantially the same absolute value as the third order non-linearity coefficient of the P-type transconductor, but the signs are opposite.

Accordingly, the third order non-linearity coefficient of the transconductance amplifier including the N-type transconductor 430 and the P-type transconductor 460 is about "0" (zero). Further, the transconductance amplifier of FIG. 11 may have a low third order inter-modulation product (IM3) when a 2-tone input voltage of an acceptable level is applied.

Figure 14:
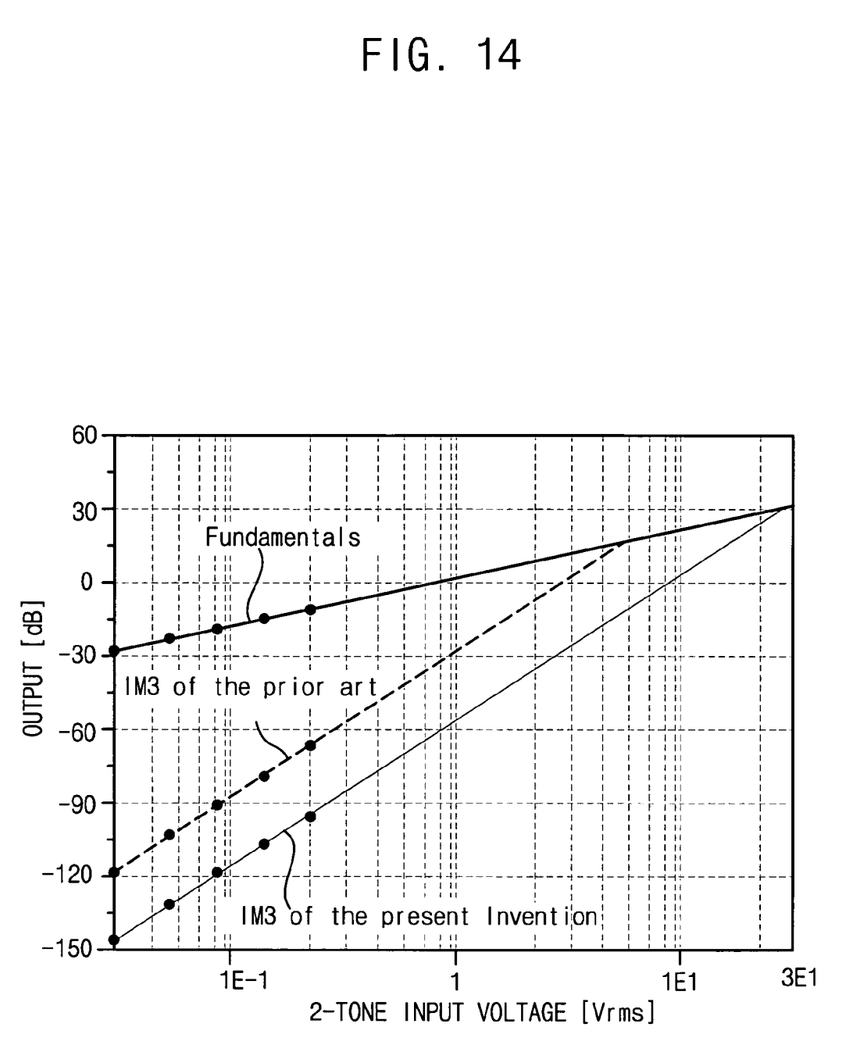
FIG. 14 is a graph that illustrates 2-tone third order differentiation characteristics for the conventional transconductance amplifier of FIG. 2 and the transconductance amplifier of FIG. 11.

FIG. 14 is a graph that illustrates 2-tone third order differentiation characteristics for the conventional transconductance amplifier of FIG. 2 and the transconductance amplifier of FIG. 11. Referring to FIG. 14, the IM3 of the complementary transconductance amplifier of FIG. 11 according to an exemplary embodiment of the present invention has a lower value than the IM3 of the conventional transconductance amplifier of FIG. 2.

Figure 15:
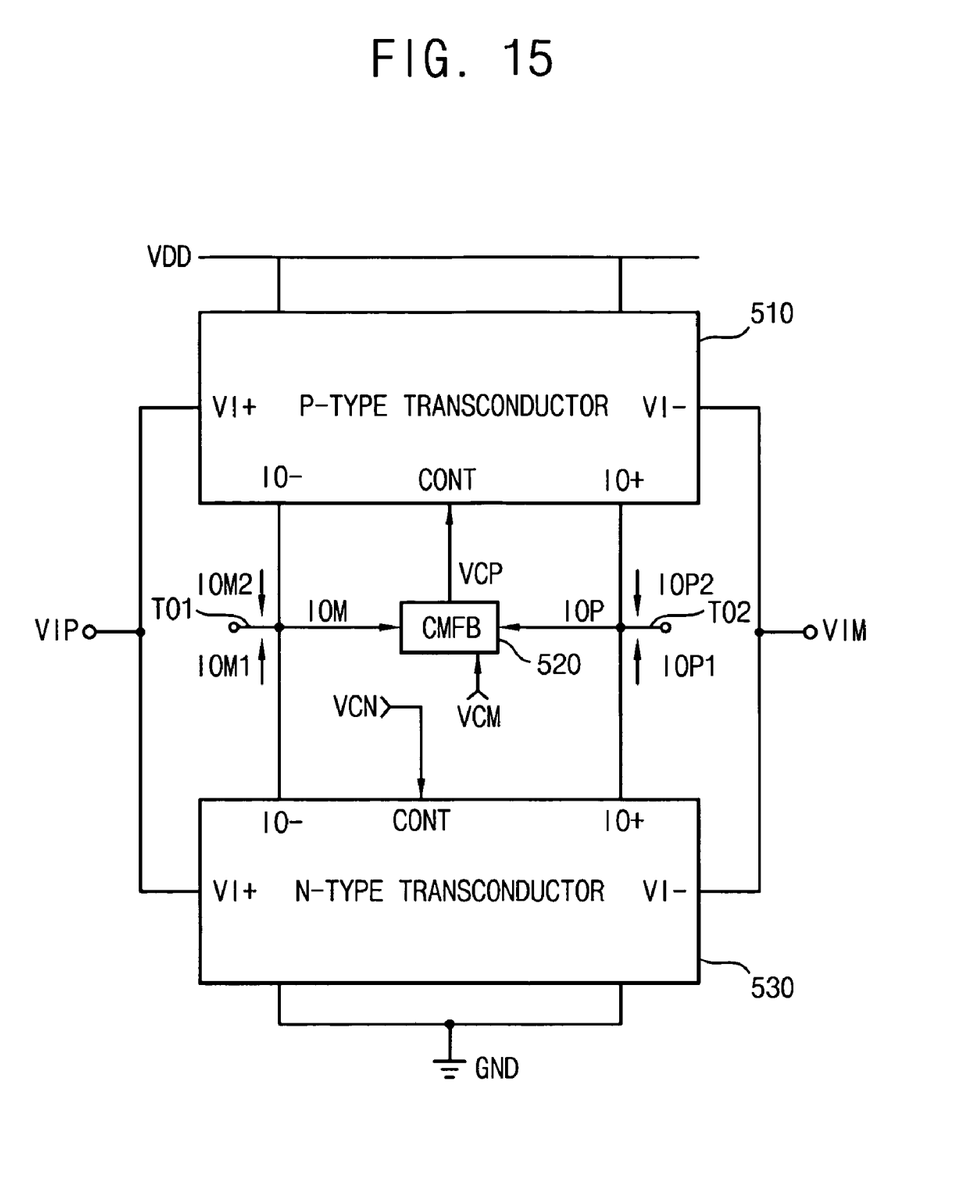
FIG. 15 is a block diagram that represents a circuit combining the transconductors of FIG. 4, FIG. 6, FIG. 7 and FIG. 11.

FIG. 15 is a block diagram that represents the transconductors of FIG. 4, FIG. 6, FIG. 7 and FIG. 11.

Referring to FIG. 15, the transconductance amplifier includes an N-type transconductor 530, a P-type transconductor 510 and a common mode feedback circuit 520. The N-type transconductor 530 has an input terminal pair Vi+ and Vi−, an output terminal pair IO+ and IO− and a control terminal CONT. The input signals VIP and VIM are received through the input terminal pair Vi+ and Vi−, and the output signals IO+ and IO− are outputted through the output terminal pair IO+ and IO−. The control signal VCN is received through the control terminal CONT. The P-type transconductor 510 has an input terminal pair Vi+ and Vi−, an output terminal pair IO+ and IO− and a control terminal CONT. The input signals VIP and VIM are received through the input terminal pair Vi+ and Vi−, and the output signals IO+ and IO− are outputted through the output terminal pair IO+ and IO−. The control signal VCP is received through the control terminal CONT. The common mode feedback circuit 520 generates the control signal VCP in response to the differential output signal pair IOP and IOM under the control of the common mode control signal VCM. The transconductance amplifier according to an exemplary embodiment of the present invention, which is shown in FIG. 15, is a complementary transconductance amplifier having the N-type transconductor 530 and the P-type transconductor 510 between the supply voltage VDD and the ground voltage GND.

Figure 16:
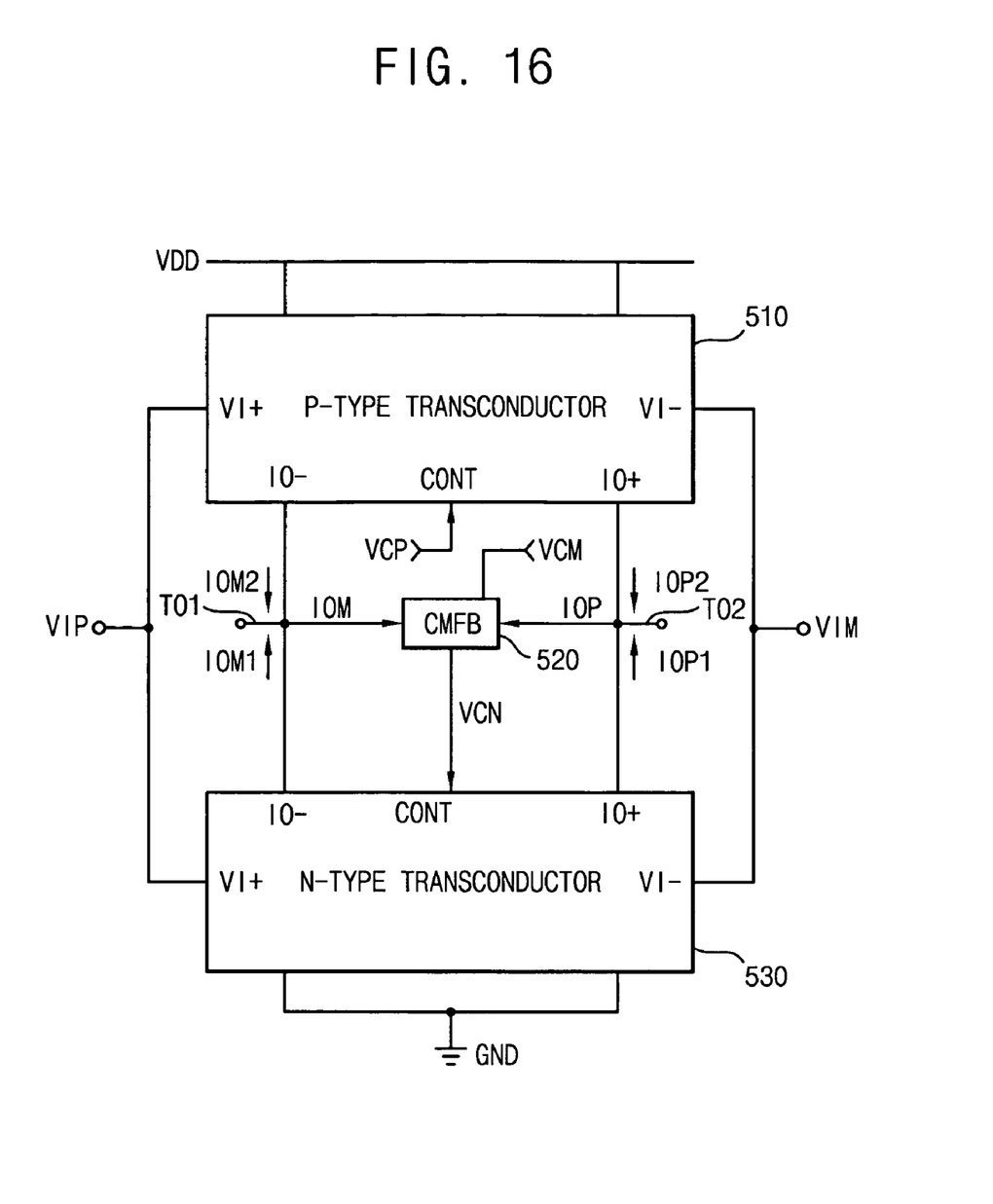
FIG. 16 is a block diagram illustrating a transconductance amplifier when an external control signal is applied to a P-type transconductor according an exemplary embodiment of the present invention.

FIG. 16 is a block diagram illustrating a transconductance amplifier when an external control signal is applied to a P-type transconductor according an exemplary embodiment of the present invention.

In the transconductance amplifier of FIG. 16, the control signal VCP is applied to the P-type transconductor 510, and the output signal of the common mode feedback circuit 520 is applied to the control terminal CONT of the N-type transconductor 530 as a control signal VCN. The remaining portions of FIG. 16 are substantially similar to FIG. 15, and the operation of the circuit of FIG. 16 is substantially similar to FIG. 15. Therefore, the particular operation of the circuit of FIG. 16 is omitted.

As described above, the transconductance amplifier according to an exemplary embodiment of the present invention has a complementary structure, improved linearity and lower power consumption. Further, an adjustment range of transconductance of the transconductance amplifier according to an exemplary embodiment of the present invention may be broadened compared with the conventional transconductance amplifier.

While exemplary embodiments of the present invention have been described in detail, it should be understood that various changes, substitutions and alterations can be made herein without departing from the scope of the invention.

What is claimed is:

1. A transconductance amplifier, comprising:
a first-type transconductor for generating a first differential output signal pair in response to a differential input signal pair under control of a first control signal;
a second-type transconductor for generating a second differential output signal pair in response to the differential input signal pair under control of a second control signal; and
a common mode feedback circuit for generating the second control signal in response to the first and second differential output signal pairs under control of a common mode control signal, wherein the common mode feedback circuit generates a comparison output signal by comparing the first and second differential output signal pairs with the common mode control signal, and limits a variation range of the comparison output signal to generate the second control signal.

2. The transconductance amplifier of claim 1, wherein the first control signal is provided from an exterior of the transconductance amplifier.

3. The transconductance amplifier of claim 1, wherein the first-type transconductor is coupled to a first supply voltage and the second-type transconductor is coupled to a second supply voltage which is complementary to the first supply voltage.

4. The transconductance amplifier of claim 3, wherein the first supply voltage is a lower supply voltage and the second supply voltage is a higher supply voltage.

5. The transconductance amplifier of claim 4, wherein the first-type transconductor is an N-type transconductor including at least one NMOS transistor and the second-type transconductor is a P-type transconductor including at least one PMOS transistor.

6. The transconductance amplifier of claim 5, wherein the first-type transconductor includes:
a first NMOS transistor having a gate to which a first input signal of the differential input signal pair is applied and a source coupled to the first supply voltage;
a second NMOS transistor having a gate to which a second input signal of the differential input signal pair is applied and a source coupled to the first supply voltage;
a third NMOS transistor having a gate to which the first control signal is applied, a source coupled to the drain of the first NMOS transistor and a drain coupled to a first output terminal; and
a fourth NMOS transistor having a gate to which the first control signal is applied, a source coupled to the drain of the second NMOS transistor and a drain coupled to a second output terminal.

7. The transconductance amplifier of claim 6, wherein the second-type transconductor includes:
a first PMOS transistor having a gate to which the first input signal is applied and a source coupled to the second supply voltage;
a second PMOS transistor having a gate to which the second input signal is applied and a source coupled to the second supply voltage;
a third PMOS transistor having a gate to which the second control signal is applied, a source coupled to the drain of the first PMOS transistor and a drain coupled to the first output terminal; and
a fourth PMOS transistor having a gate to which the second control signal is applied, a source coupled to the drain of the second PMOS transistor and a drain coupled to the second output terminal.

8. The transconductance amplifier of claim 4, wherein the first-type transconductor including the at least one NMOS transistor and at least one NPN transistor, and the second-type transconductor including the at least one PMOS transistor and at least one PNP transistor.

9. The transconductance amplifier of claim 8, wherein the first-type transconductor includes:
a first NMOS transistor having a gate to which a first input signal of the differential input signal pair is applied and a source coupled to the first supply voltage;
a second NMOS transistor having a gate to which a second input signal of the differential input signal pair is applied and a source coupled to the first supply voltage;
a first NPN transistor having a base to which the first control signal is applied, an emitter coupled to the drain of the first NMOS transistor and a collector coupled to a first output terminal; and a second NPN transistor having a base to which the first control signal is applied, an emitter coupled to the drain of the second NMOS transistor and a collector coupled to a second output terminal.

10. The transconductance amplifier of claim 9, wherein the second-type transconductor includes:
a first PMOS transistor having a gate to which the first input signal is applied and a source coupled to the second supply voltage;
a second PMOS transistor having a gate to which the second input signal is applied and a source coupled to the second supply voltage;
a first PNP transistor having a base to which the second control signal is applied, an emitter coupled to the drain of the first PMOS transistor and a collector coupled to the first output terminal; and
a second PNP transistor having a base to which the second control signal is applied, an emitter coupled to the drain of the second PMOS transistor and a collector coupled to the second output terminal.

11. The transconductance amplifier of claim 4, wherein the first-type transconductor including the at least one NMOS transistor and at least one NPN bipolar transistor, and the second-type transconductor including the at least one PMOS transistor.

12. The transconductance amplifier of claim 11, wherein the first-type transconductor includes:
a first NMOS transistor having a gate to which a first input signal is applied and a source coupled to the first supply voltage;
a second NMOS transistor having a gate to which a second input signal is applied and a source coupled to the first supply voltage;
a first NPN transistor having a base to which the first control signal is applied, an emitter coupled to the drain of the first NMOS transistor and a collector coupled to a first output terminal; and
a second NPN transistor having a base to which the first control signal is applied, an emitter coupled to the drain of the second NMOS transistor and a collector coupled to a second output terminal.

13. The transconductance amplifier of claim 12, wherein the second-type transconductor includes:
a first PMOS transistor having a gate to which the first input signal is applied and a source coupled to the second supply voltage;
a second PMOS transistor having a gate to which the second input signal is applied and a source coupled to the second supply voltage;
a third PMOS transistor having a gate to which the second control signal is applied, a source coupled to the drain of the first PMOS transistor and a drain coupled to the first output terminal; and
a fourth PMOS transistor having a gate to which the second control signal is applied, a source coupled to the drain of the second PMOS transistor and a drain coupled to the second output terminal.

14. The transconductance amplifier of claim 4, wherein the first-type transconductor including the at least one NMOS transistor and at least one NPN bipolar transistors, and the second-type transconductor including the at least one PMOS transistor and at least one resistor.

15. The transconductance amplifier of claim 14, wherein the first-type transconductor includes:
a first NMOS transistor having a gate to which a first input signal of the differential input signal pair is applied and a source coupled to the first supply voltage;
a second NMOS transistor having a gate to which a second input signal of the differential input signal pair is applied and a source coupled to the first supply voltage;
a first NPN transistor having a base to which the first control signal is applied, an emitter coupled to the drain of the first NMOS transistor and a collector coupled to a first output terminal; and
a second NPN transistor having a base to which the first control signal is applied, an emitter coupled to the drain of the second NMOS transistor and a collector coupled to a second output terminal.

16. The transconductance amplifier of claim 15, wherein the second-type transconductor includes:
a first PMOS transistor having a gate to which the second control signal is applied and a source coupled to the second supply voltage;
a second PMOS transistor having a gate to which the second control signal is applied and a source coupled to the second supply voltage;
a first resistor having a first terminal coupled to a drain of the first PMOS transistor; a second resistor having a first terminal coupled to a drain of the second PMOS transistor;
a third PMOS transistor having a gate to which the first input signal is applied, a source coupled to a second terminal of the first resistor and a drain coupled to the first output terminal; and
a fourth PMOS transistor having a gate to which the second input signal is applied, a source coupled to a second terminal of the second resistor and a drain coupled to the second output terminal.

17. The transconductance amplifier of claim 4, wherein the common mode feedback circuit includes:
a common mode component comparator for generating a comparison output signal based on a comparison of a first output signal and a second output signal of the transconductance amplifier with the common mode control signal; and
a voltage level limiting circuit for limiting a variation range of the comparison output signal to generate the second control signal.

18. A method of amplifying transconductance, comprising:
generating a first differential output signal pair in response to a differential input signal pair under the control of a first control signal;
generating a second differential output signal pair in response to the differential input signal pair under the control of a second control signal; and
generating the second control signal in response to the first and second differential output signal pairs under the control of a common mode control signal,
wherein the generating the second control signal includes,
generating a comparison output signal by comparing a first output signal and a second output signal of a transconductance amplifier with the common mode control signal; and
limiting a variation range of a compared signal to generate the second control signal.

19. The method of claim 18, wherein the first control signal is provided from external to a transconductance amplifier for performing the method of amplifying transconductance.

* * * * *